(12) United States Patent
Liang et al.

(10) Patent No.: US 10,490,615 B2
(45) Date of Patent: Nov. 26, 2019

(54) DISPLAY APPARATUS AND MANUFACTURING METHOD THEREOF, REPAIRING METHOD FOR DISPLAY APPARATUS

(71) Applicant: BOE Technology Group Co., Ltd., Beijing (CN)

(72) Inventors: Zhiwei Liang, Beijing (CN); Yingwei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/150,374

(22) Filed: Oct. 3, 2018

(65) Prior Publication Data

US 2019/0109180 A1    Apr. 11, 2019

(30) Foreign Application Priority Data

Oct. 10, 2017    (CN) .......................... 2017 1 0934566

(51) Int. Cl.
*H01L 27/146*    (2006.01)
*H01L 27/32*    (2006.01)
*H01L 51/56*    (2006.01)
*H01L 51/52*    (2006.01)

(52) U.S. Cl.
CPC .... *H01L 27/3251* (2013.01); *H01L 27/14603* (2013.01); *H01L 51/5212* (2013.01); *H01L 51/56* (2013.01); *H01L 27/3276* (2013.01); *H01L 2227/323* (2013.01); *H01L 2251/568* (2013.01)

(58) Field of Classification Search
CPC .......................... H01L 27/30; H01L 2251/50
See application file for complete search history.

(56) References Cited

U.S. PATENT DOCUMENTS

| 2009/0315456 | A1* | 12/2009 | Furukawa | H01L 27/326 313/504 |
| 2016/0133681 | A1* | 5/2016 | Nam | H01L 51/5265 257/40 |
| 2018/0114820 | A1* | 4/2018 | Shim | H01L 27/322 |

* cited by examiner

*Primary Examiner* — Cheung Lee
(74) *Attorney, Agent, or Firm* — Nath, Goldberg & Meyer; Joshua B. Goldberg

(57) ABSTRACT

A display apparatus is provided, which includes a rigid substrate; a first carrier plate provided on a first surface of the rigid substrate; a first substrate provided on the first carrier plate, the first substrate including a thin film transistor with a drain; a light emitting assembly provided on a second surface of the rigid substrate distal to the first surface, the light emitting assembly including an anode and a light emitting layer provided successively along a direction distal to the rigid substrate; and a via hole provided penetrating the rigid substrate and the first carrier plate, the anode electrically coupled to the drain through the via hole. In the display apparatus of the present disclosure the light emitting assembly is separated from the array substrate such that when the light emitting assembly or the first substrate suffers from failure, it can be replaced easily.

20 Claims, 5 Drawing Sheets

DISPLAY APPARATUS AND MANUFACTURING METHOD THEREOF, REPAIRING METHOD FOR DISPLAY APPARATUS

CROSS REFERENCE TO RELATED APPLICATIONS

The present application claims the priority of the Chinese Patent Application with the Application No. 201710934566.5 filled Oct. 10, 2017, which is incorporated herein in the entire by reference.

TECHNICAL FIELD

The present disclosure relates to the field of display technology, in particular to a display apparatus and a manufacturing method thereof, a repairing method for the display apparatus.

BACKGROUND

An existing AMOLED (Active-matrix organic light emitting diode) display screen is usually manufactured on one surface of high polymeric organics, a metal foil or an ultra-thin glass substrate. The display screen generally includes an active driving array substrate, a driving circuit, a light emitting assembly, etc., with the array substrate being inseparable from the light emitting assembly.

SUMMARY

The present disclosure provides a display apparatus and a manufacturing method thereof, a repairing method for the display apparatus.

In an aspect, the present disclosure provides a display apparatus, including:
a rigid substrate;
a first carrier plate provided on a first surface of the rigid substrate;
a first substrate provided on the first carrier plate, the first substrate including a thin film transistor with a drain;
a light emitting assembly provided on a second surface of the rigid substrate opposite to the first surface, the light emitting assembly including an anode and a light emitting layer provided successively along a direction distal to the rigid substrate; and
a via hole provided penetrating the rigid substrate and the first carrier plate, the anode electrically coupled to the drain through the via hole.

In an embodiment of the present disclosure, the display apparatus further includes: a groove provided on a surface of the first carrier plate at a side of the first substrate, wherein
the drain includes a body and a connection extension portion; the body is provided on the first carrier plate at a side of the groove; and the connection extension portion extends from one end of the body into the groove; and
an orthographic projection of the via hole on the rigid substrate is within an orthographic projection of the groove on the rigid substrate.

In an embodiment of the present disclosure, a width of the groove is greater than a diameter of the via hole.

In an embodiment of the present disclosure, the first carrier plate is a flexible substrate.

In an embodiment of the present disclosure, the thin film transistor includes a drain, a source, an active layer, a gate insulation layer, a gate layer, a gate protection layer and a planarization layer provided successively.

In an embodiment of the present disclosure, the light emitting assembly includes an anode, a pixel definition layer, a light emitting layer and a photoresist spacer provided successively.

In an embodiment of the present disclosure, the display apparatus further includes: a second carrier plate provided on the second surface of the rigid substrate, wherein
the light emitting assembly is provided on the second carrier plate; and
the via hole penetrates the second carrier plate.

In an embodiment of the present disclosure, the second carrier plate is a flexible substrate.

In an aspect, the present disclosure provides a manufacturing method of a display apparatus, including steps of:
preparing a rigid substrate;
forming a first carrier plate on a first surface of the rigid substrate;
forming a first substrate on the first carrier plate, such that the first substrate includes a thin film transistor with a drain;
forming a via hole penetrating the rigid substrate and the first carrier plate; and
forming a light emitting assembly on a second surface of the rigid substrate opposite to the first surface, such that the light emitting assembly includes an anode and a light emitting layer provided successively along a direction distal to the rigid substrate;
wherein the anode electrically coupled to the drain through the via hole.

In an embodiment of the present disclosure, the step of forming a first carrier plate on a first surface of the rigid substrate includes steps of:
forming a whole film layer for the first carrier plate on the first surface of the rigid substrate; and
forming a groove in the whole film layer for the first carrier plate.

In an embodiment of the present disclosure, the drain includes a body and a connection extension portion; the body is provided on the first carrier plate at a side of the groove; the connection extension portion extends from one end of the body into the groove; and an orthographic projection of the via hole on the rigid substrate is within an orthographic projection of the groove on the rigid substrate.

In an embodiment of the present disclosure, the step of forming the via hole is performed by using a wet etching method.

In an embodiment of the present disclosure, the step of forming the light emitting assembly on the second surface of the rigid substrate opposite to the first surface includes steps of:
forming a second carrier plate on the second surface of the rigid substrate; and
forming the light emitting assembly on the second carrier plate;
the step of forming a via hole penetrating the rigid substrate and the first carrier plate further includes: forming a via hole penetrating the second carrier plate, the rigid substrate and the first carrier plate.

In an aspect, the present disclosure provides a repairing method for the display apparatus, including steps of:
stripping the rigid substrate off a surface of the first carrier plate distal to the first substrate; and
forming a new light emitting assembly on the surface of the first carrier plate distal to the first substrate.

In an embodiment of the present disclosure, the step of forming a new light emitting assembly on the surface of the first carrier plate distal to the first substrate includes steps of:

fixing the stripped first carrier plate on a fixing substrate with the drain facing upward; and forming the new light emitting assembly on a surface of the fixing substrate, In an aspect, the present disclosure provides a repairing method for the display apparatus, including steps of:

stripping the second carrier plate off a surface of the rigid substrate distal to the first substrate; and forming a new light emitting assembly on the surface of the rigid substrate distal to the first substrate.

In an embodiment of the present disclosure, the step of forming a new light emitting assembly on the surface of the rigid substrate distal to the first substrate includes steps of:

causing the drain to face upward; and forming the new light emitting assembly on the surface of the rigid substrate distal to the first substrate.

In an embodiment of the present disclosure, the repairing method further includes steps of:

stripping the rigid substrate off a surface of the first carrier plate distal to the first substrate;

fixing the stripped first carrier plate on a fixing substrate with the drain facing upward; and forming a new light emitting assembly on the fixing substrate.

DETAIL DESCRIPTION OF EMBODIMENTS

A display apparatus and a manufacturing method thereof, a repairing method for the display apparatus of the present disclosure will be described in details below in conjunction with the accompanying drawings such that those skilled in the art can understand the technical solution of the present disclosure better.

The main reason of leading to a low yield for an organic light emitting diode (OLED) in a light emitting assembly of the AMOLED display screen is generally badness (such as, color mixing) occurring in a light emitting layer of the OLED. In a manufacturing process of the AMOLED display screen, if there is badness in a light emitting layer of the OLED, there is accordingly badness in the entire display screen, and since it is difficult to repair the light emitting layer of the OLED, the entire display screen will be useless.

The present disclosure has the following beneficial effects:

In a display apparatus and a manufacturing method of the present disclosure, a first substrate and a light emitting assembly are provided on two opposite sides of a rigid substrate, by forming a first carrier plate on a first surface of the rigid substrate and forming the first substrate on the first carrier plate, forming the light emitting assembly on a second surface of the rigid substrate opposite to the first surface, and causing an anode of the light emitting assembly to be electrically coupled to a drain of a thin film transistor of the first substrate through a via hole, thus the light emitting assembly can be separated from the first substrate by separating the rigid substrate from the first carrier plate, such that when the light emitting assembly or the first substrate suffers from failure, it may be replaced easily, which can avoid the possibility that the entire display apparatus is useless, and accordingly reduce the manufacturing cost.

Figure 1A:
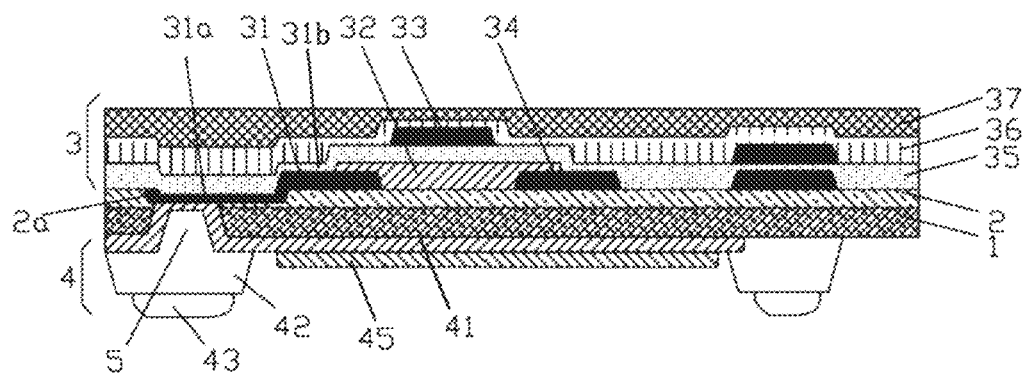
FIG. 1A is a structural diagram of a display apparatus according to an embodiment of the present disclosure.
Figure 1B:
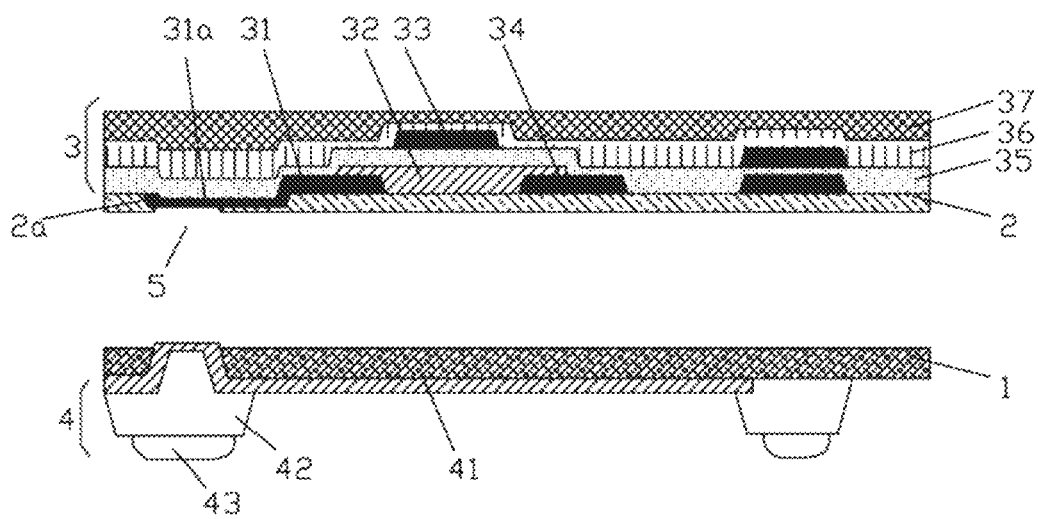
FIG. 1B is a structural diagram of a display apparatus in the case where an array substrate is separated from the light emitting assembly according to an embodiment of the present disclosure.

FIG. 1A is a structural diagram of a display apparatus according to an embodiment of the present disclosure; FIG. 1B is a structural diagram of a display apparatus in the case where an array substrate is separated from the light emitting assembly according to an embodiment of the present disclosure.

Referring to FIG. 1A and FIG. 1B, the display apparatus according to the embodiment of the present disclosure includes a rigid substrate 1, such as high polymeric organics, a metal foil or a glass substrate. A first carrier plate 2 is provided on a first surface of the rigid substrate 1. A first substrate 3 is provided on the first carrier plate 2, the first substrate 3 is for example an array substrate, including a thin film transistor with a drain 31, a source 34, an active layer 32, a gate insulation layer 35, a gate layer 33, a gate protection layer 36 and a planarization layer 37 provided successively. Certainly, in an actual application, the corresponding functional layers may be added or omitted according to specific requirements.

A light emitting assembly 4 is provided on a second surface of the rigid substrate 1 opposite to the first surface, that is, the light emitting assembly 4 is provided on a side of the rigid substrate 1 distal to the first substrate 3. The light emitting assembly 4 includes an anode 41, a pixel definition layer 42, a light emitting layer 45 (as shown in FIG. 1A, omitted in other figures) and a photoresist spacer 43 provided successively along a direction distal to the rigid substrate 1. A via hole 5 is formed to penetrate the rigid substrate 1 and the first carrier plate 2, with the anode 41 electrically coupled to the drain 31 of the thin film transistor of the first substrate 3 through the via hole 5. The active layer 32 is formed of an oxide material, such as IGZO (Indium Gallium Zinc Oxide), to satisfy the requirement for the high mobility of the light emitting assembly 4.

The light emitting assembly 4 can be separated from the first substrate 3 by stripping the first carrier plate 2 off the rigid substrate 1 (as shown in FIG. 1B), such that when the light emitting assembly 4 or the first substrate 3 suffers from failure, it can be easily replaced, which can prevent the entire display apparatus from becoming useless, and accordingly reduce the manufacturing cost.

Optionally, the first carrier plate 2 may be a flexible substrate, which is made of an high polymer organic material of light-sensitive type (such as, PI). Such a material can be easily stripped off the rigid substrate 1 by pulses laser illumination.

Optionally, a groove 2a is further provided on a surface of the first carrier plate 2 at a side of the first substrate 3 (that is, a surface facing the first substrate 3); and the drain 31 includes a body 31b and a connection extension portion 31a; the body 31b is provided on the first carrier plate 2 at a side of the groove 2a; the connection extension portion 31a extends from one end of the body 31b into the groove 2a. That is, the groove 2a is used to accommodate the connection extension portion 31a. Also, an orthographic projection of the via hole 5 on the rigid substrate 1 is within an orthographic projection of the groove 2a on the rigid substrate 1. In this way, the via, hole 5 is communicated with the groove 2a, such that the anode 41 can be electrically coupled to the connection extension portion 31a in the groove 2a through the via hole 5. Due to a small thickness of the first carrier plate 2 at the groove 2a, the via hole 5 is easily formed. In an embodiment of the present disclosure, the drain and the source may be formed interchangeably. That is, the source may include a body and a connection extension portion; this body may be provided on the first carrier plate 2 at a side of the groove 2a; and the connection extension portion extends from one end of the body into the groove 2a.

Optionally, a width of the groove 2a may be greater than a diameter of the via hole 5, In this way, the anode 41 may be in electric contact with only a part of the connection extension portion 31a in the groove 2a, such that even if the connection extension portion 31a is damaged when the anode 41 is separated from the connection extension portion 31a, a remaining part of the connection extension portion 31a which is not in contact with the stripped anode 41 may be used to be in electrical contact with a new anode 41, thereby reducing the probability of scrap of the display apparatus.

Figure 2A:
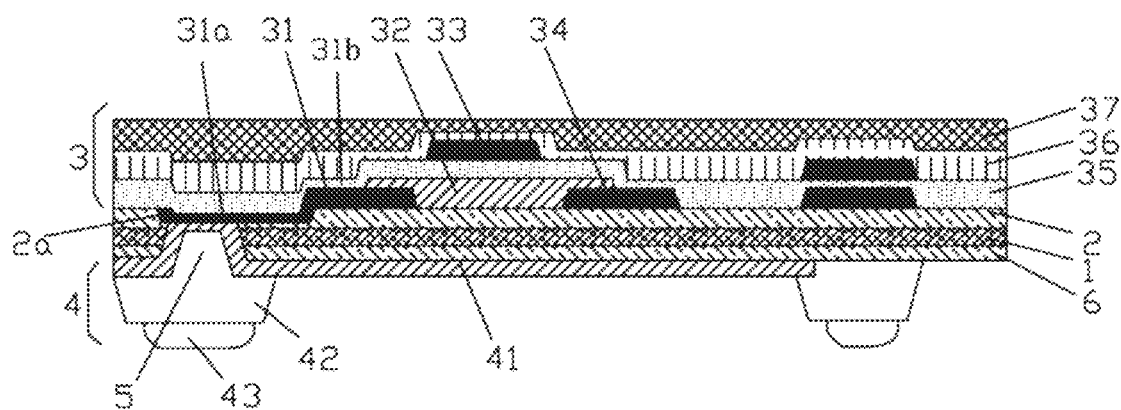
FIG. 2A is a structural diagram of a display apparatus according to an embodiment of the present disclosure.
Figure 2B:
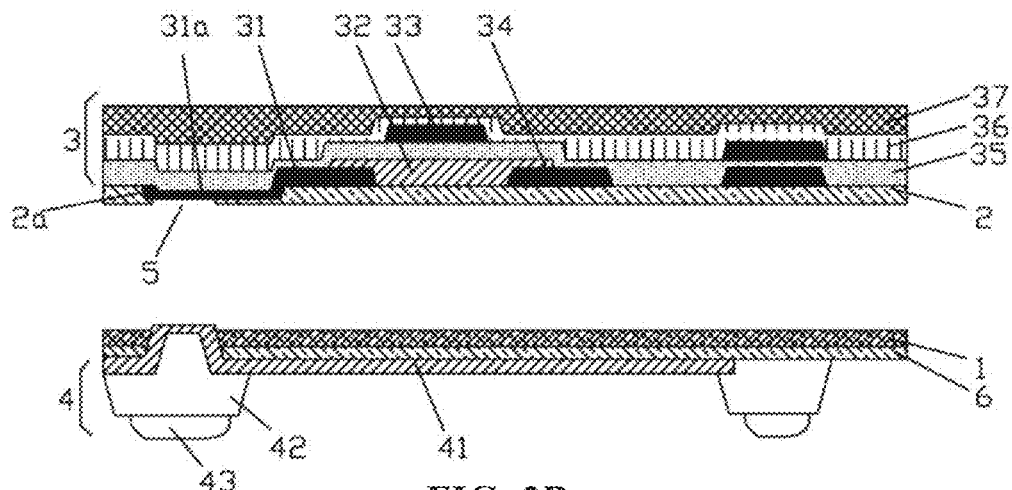
FIG. 2B is a structural diagram of a display apparatus in the case where the array substrate is separated from the light emitting assembly according to an embodiment of the present disclosure.
Figure 2C:
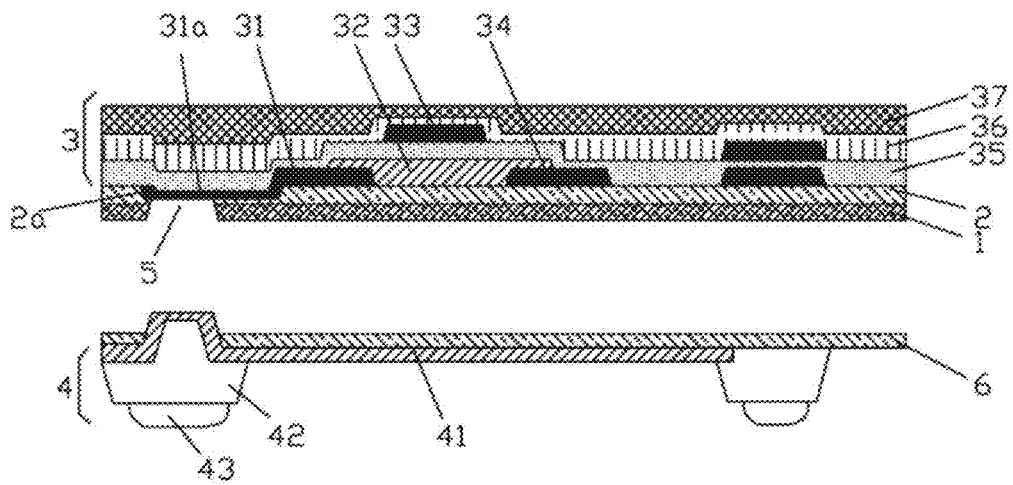
FIG. 2C is another structural diagram of a display apparatus in the case where the array substrate is separated from the light emitting assembly according to an embodiment of the present disclosure.

FIG. 2A is a structural diagram of a display apparatus according to an embodiment of the present disclosure; FIG. 2B is a structural diagram of a display apparatus in the case where an array substrate is separated from the light emitting assembly according to an embodiment of the present disclosure; FIG. 2C is a structural diagram of a display apparatus in the case where an array substrate is separated from the light emitting assembly according to an embodiment of the present disclosure.

Referring to FIG. 2A through FIG. 2C, the difference between the display apparatus according to the embodiment of the present disclosure and the display apparatus as described in connection with FIG. 1A and FIG. 1B is in that a second carrier plate 6 is further provided in the display apparatus as described in connection with FIG. 2A through FIG. 2C.

In particular, the second carrier plate 6 is provided on the second surface of the rigid substrate 1, and the light emitting assembly 4 is provided on the second carrier plate 6. That is, the first carrier plate and the second carrier plate are provided on two opposite sides of the rigid substrate 1, respectively. The via hole 5 penetrates the second carrier plate 6, the rigid substrate 1, and the first carrier plate 2 successively.

With the second carrier plate 6, the present disclosure may employ two separation methods. One separation method is: stripping the first carrier plate 2 off the rigid substrate 1, as shown in FIG. 2B, such that the light emitting assembly 4 can be separated from the first substrate 3.

The other separation method is: stripping the second carrier plate 6 off the rigid substrate 1, as shown in FIG. 2C, such that the light emitting assembly 4 can be separated from the first substrate 3, and the rigid substrate 1 still adheres to the first carrier plate 2, which helps to form a new light emitting assembly on the second surface of the rigid substrate 1 in a subsequent step.

Optionally, the second carrier plate 6 is a flexible substrate, which is made of a high polymer organic material of a light-sensitive type (such as, PI). Such a material can be easily stripped off the rigid substrate 1 by pulses laser illumination.

From the above, in the display apparatus according to the embodiment of the present disclosure, the first substrate 3 and the light emitting assembly 4 are provided on two opposite sides of the rigid substrate 1, and the light emitting assembly 4 is separated from the first substrate 3, such that when the light emitting assembly 4 or the first substrate 3 suffers from failure, it can be replaced easily, which can prevent the entire display apparatus from becoming useless, reducing the manufacturing cost.

FIGS. 3A through 3I are schematic diagrams of the respective structures formed in steps of a manufacturing method of a display apparatus according to an embodiment of the present disclosure.

Figure 3A:
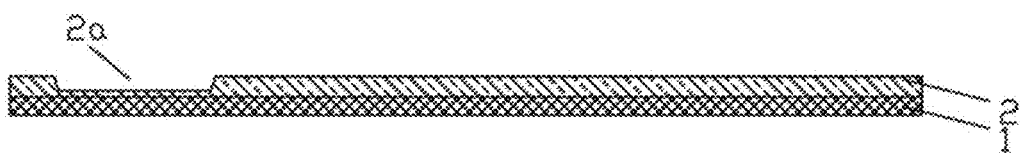
FIGS. 3A through 3I are process diagrams illustrating a manufacturing method of a display apparatus according to an embodiment of the present disclosure.
Figure 3B:
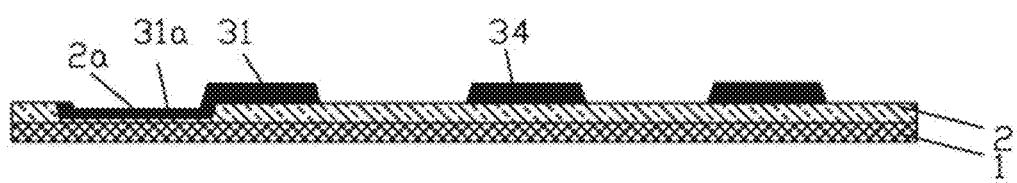
Figure 3C:
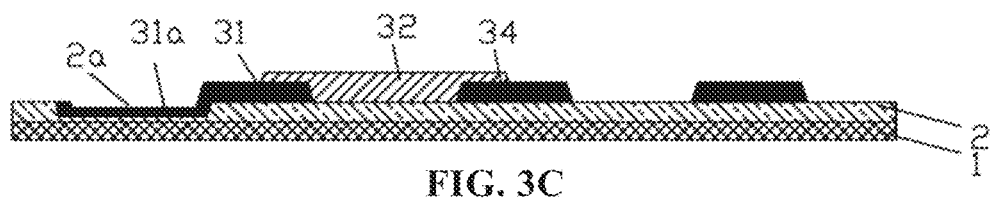
Figure 3D:
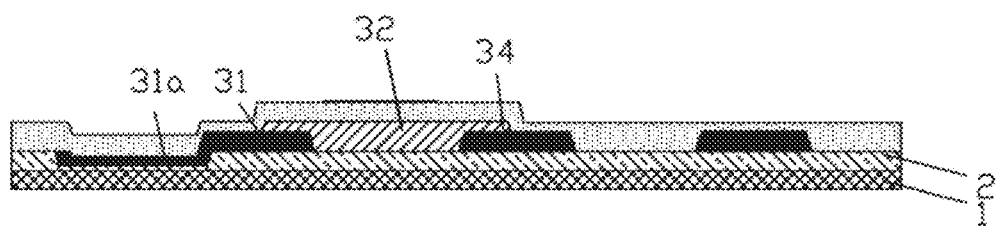
Figure 3E:
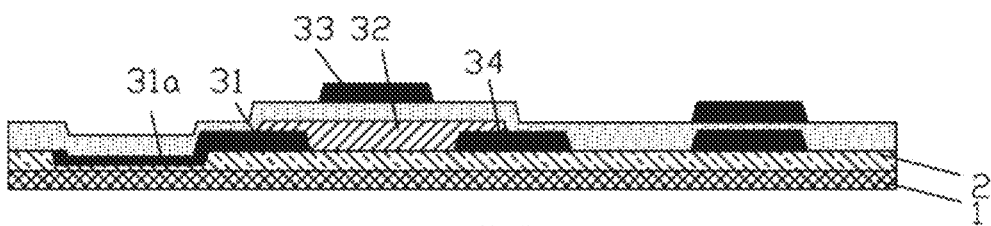
Figure 3F:
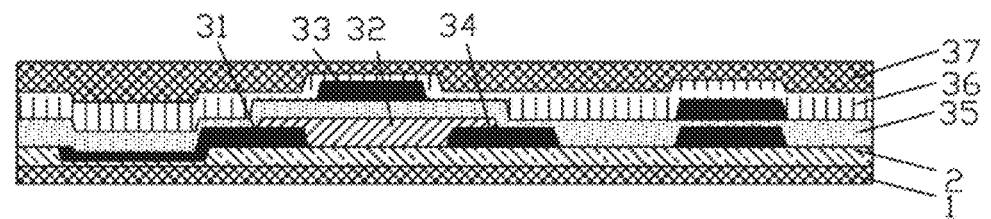
Figure 3G:
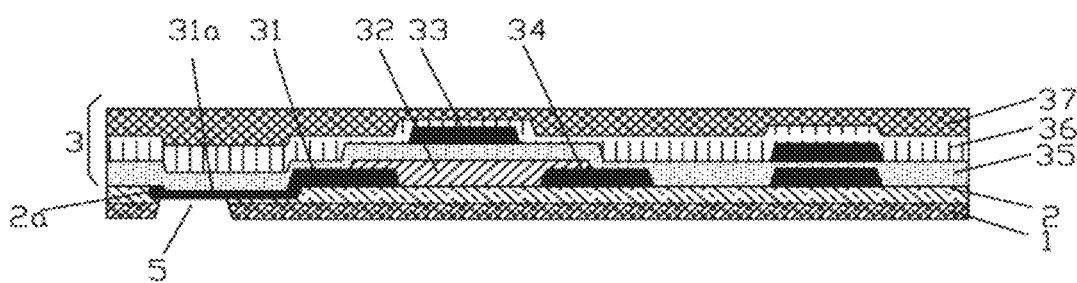
Figure 3H:
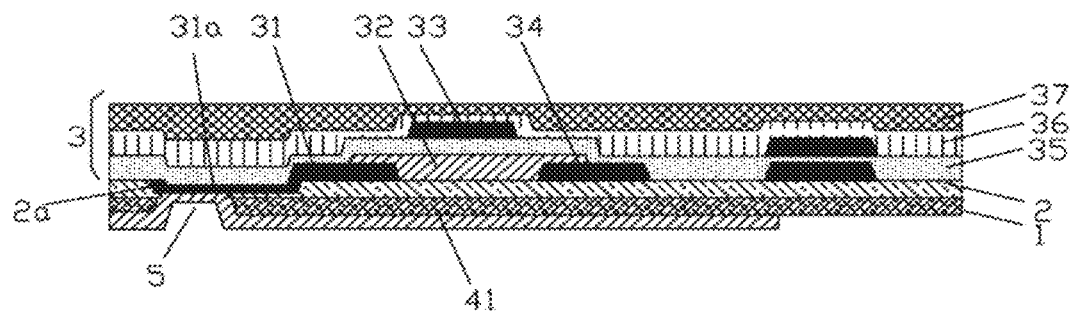
Figure 3I:
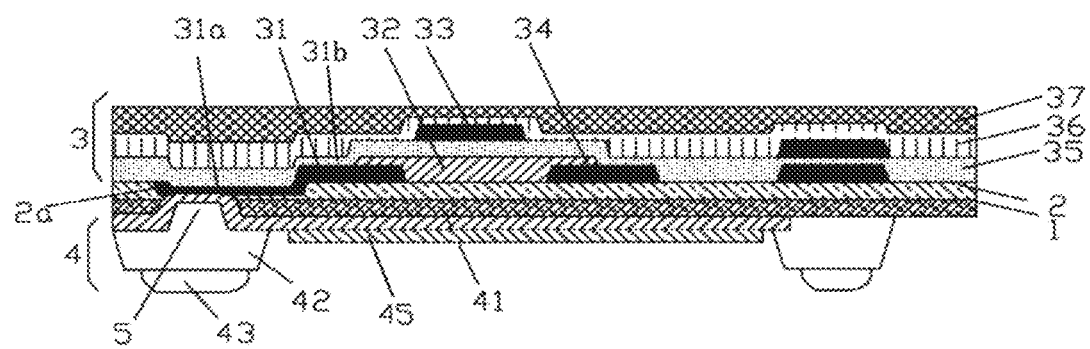
Figure 4:
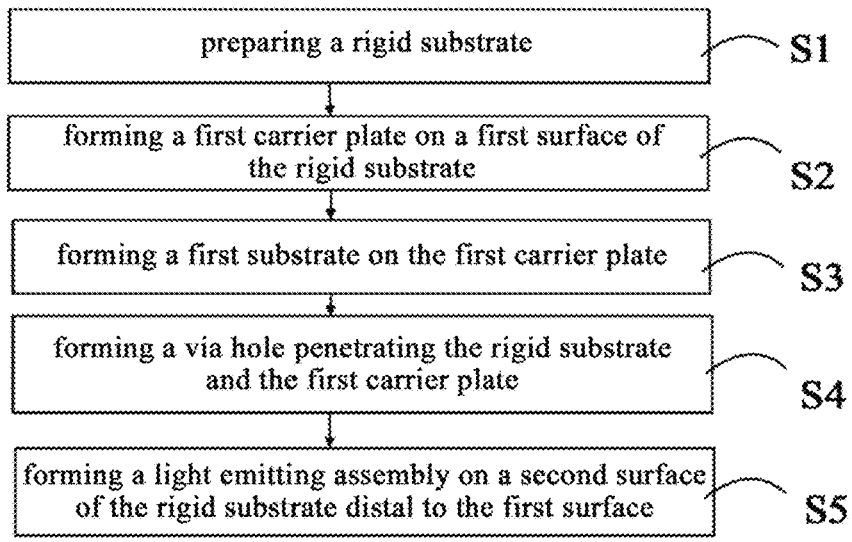
FIG. 4 shows a flow diagram of a manufacturing method of a display apparatus according to an embodiment of the present disclosure.

In another aspect, FIG. 4 further shows a flow diagram of a manufacturing method of a display apparatus according to an embodiment of the present disclosure. Referring to FIG. 3A through 3I together with FIG. 4, the embodiment of the present disclosure further provides a manufacturing method of a display apparatus according to the embodiment of the present disclosure, including the following steps S1 through S5:

S1: preparing a rigid substrate 1;

S2: forming a first carrier plate 2 on a first surface of the rigid substrate 1, Specifically, as shown in FIG. 3A, the step S2 further includes the following steps:

forming a whole film layer for the first carrier plate 2 on the first surface of the rigid substrate 1; and forming a groove 2a on the whole film layer for the first carrier plate 2.

S3: forming a first substrate 3 on the first carrier plate 2, such that the first substrate includes a thin film transistor. The thin film transistor includes a drain 31 (FIG. 3B), a source 34 (FIG. 3B), an active layer 32 (FIG. 3C), a gate insulation layer 35 (FIG. 3D), a gate layer 33 (FIG. 3E), a gate protection layer 36 (FIG. 3F) and a planarization layer 37 (FIG. 3F) provided successively.

Note that, a component of a storage capacitor (at the right side of the source 34 in FIG. 3B) is formed at the same time as the source 34 in FIG. 3B, and another component of the storage capacitor (at the right side of the gate layer 33 in FIG. 3E) is formed at the same time as the gate layer 33 in FIG. 3E. These two components used as the storage capacitor are just shown as an example, and other components may be formed when the thin film transistor is formed, which is not limited in the present disclosure.

S4: forming a via hole 5 penetrating the rigid substrate 1 and the first carrier plate 2, as shown in FIG. 3G. The via hole 5 may be formed by using a wet etching method.

S5: forming a light emitting assembly 4 on a second surface of the rigid substrate 1 opposite to the first surface, such that the light emitting assembly 4 includes an anode 41 (FIG. 3H), a pixel definition layer 42 (FIG. 3I), a light emitting layer 45 (FIG. 3I) and a photoresist spacer 43 (FIG.

3I) provided successively along a direction distal to the rigid substrate 1. And the anode 41 is electrically coupled to the drain 31 through the via hole 5, as shown in FIG. 3I.

Optionally, the drain 31 includes a body 31*b* and a connection extension portion 31*a*; the body 31*b* is provided on the first carrier plate 2 at a side of the groove 2*a*; the connection extension portion 31*a* extends from one end of the body 31*b* into the groove 2*a*. Also, an orthographic projection of the via hole 5 on the rigid substrate 1 is within an orthographic projection of the groove 2*a* on the rigid substrate 1. In this way, the via hole 5 is communicated with the groove 2*a*, such that the anode 41 can be electrically coupled to the connection extension portion 31*a* in the groove 2*a* through the via hole 5. Due to a small thickness of the first carrier plate 2 at the groove 2*a*, the via hole 5 may be formed easily.

Figure 5:
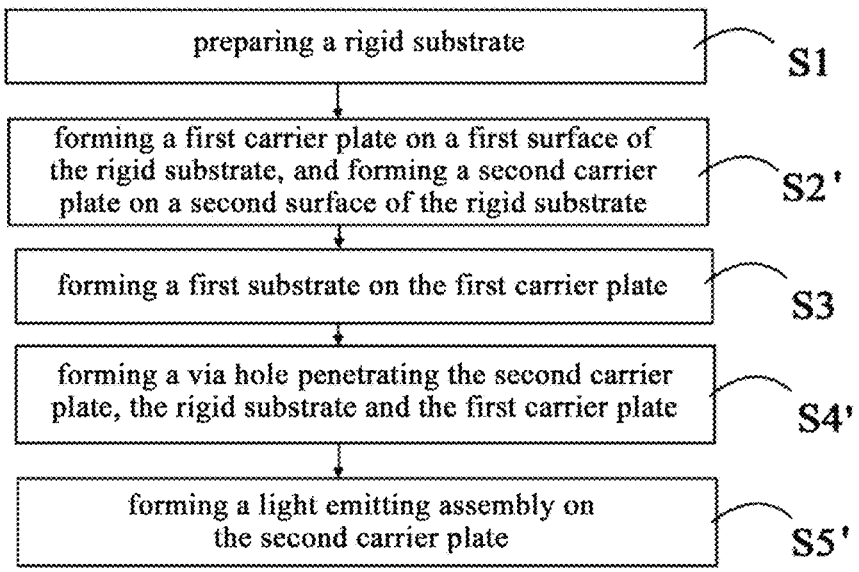
FIG. 5 shows a flow diagram of a manufacturing method of a display apparatus according to an embodiment of the present disclosure.

FIG. 5 further shows a flow diagram of a manufacturing method of a display apparatus according to an embodiment of the present disclosure. Optionally, in another aspect, the embodiment of the present disclosure further provides a manufacturing method of a display apparatus according to the embodiment of the present disclosure, which further provides a second carrier plate 6 compared to the manufacturing method as described in connection with FIG. 4. Specifically, the method includes the following steps:

S1: preparing a rigid substrate 1;

S2': forming a first carrier plate 2 on a first surface of the rigid substrate 1, and forming a second carrier plate 6 on a second surface of the rigid substrate 1 opposite to the first surface:

S3: forming a first substrate 3 on the first carrier plate 2, such that the first substrate includes a thin film transistor;

S4': forming a via hole 5 to penetrate the second carrier plate 6, the rigid substrate 1 and the first carrier plate 2; and S5': forming a light emitting assembly 4 on the second carrier plate 6.

From the above, in the manufacturing method of a display apparatus according to the embodiment of the present disclosure, the first substrate 3 and the light emitting assembly 4 are provided on two opposite sides of the rigid substrate 1, and the light emitting assembly 4 is separated from the first substrate 3, such that when the light emitting assembly 4 or the first substrate 3 suffers from failure, it can be replaced easily, which can prevent the entire display apparatus from becoming useless, reducing the manufacturing cost.

Figure 6:
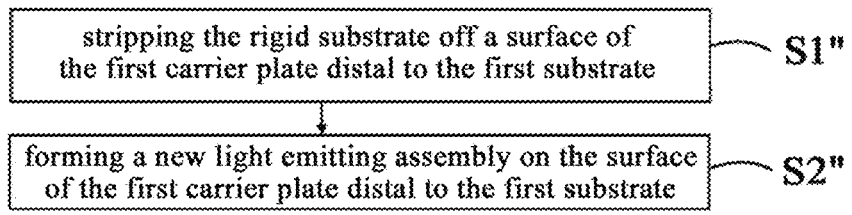
FIG. 6 shows a flow diagram of a repairing method of a display apparatus according to an embodiment of the present disclosure.

FIG. 6 further shows a flow diagram of a repairing method of a display apparatus according to an embodiment of the present disclosure. In another aspect, the embodiment of the present disclosure further provides a repairing method of a display apparatus according to the embodiment described in connection with FIGS. 1A and 1B. Specifically, the method includes the following steps S1" and S2":

S1": stripping the rigid substrate 1 off a surface of the first carrier plate 2 distal to the first substrate 3;

S2": forming a new light emitting assembly 4 on the surface of the first carrier plate 2 distal to the first substrate 3.

The light emitting assembly 4 may be separated from the first substrate 3, by stripping the first carrier plate 2 off the rigid substrate 1, such that when the light emitting assembly 4 or the first substrate 3 suffers from failure, it can be replaced easily, which can prevent the entire display apparatus from becoming useless, reducing the manufacturing cost.

The step of forming a new light emitting assembly 4 on the surface of the first carrier plate 2 distal to the first substrate 3 includes steps of:

fixing the stripped first carrier plate 2 on a fixing substrate, such as a rigid substrate such as, a glass substrate), with the drain facing upward; and forming the new light emitting assembly 4 on the fixing substrate.

With the fixing substrate and the drain facing upward, the new light emitting assembly 4 may be formed more easily.

In another aspect, the embodiment of the present disclosure further provides a repairing method of a display apparatus according to the embodiment described in connection with FIGS. 2A through 2C. Specifically, the method includes the following steps:

stripping the second carrier plate 6 off a surface of the rigid substrate 1 distal to the first substrate 3; and forming a new light emitting assembly 4 on the surface of the rigid substrate 1 distal to the first substrate 3.

The light emitting assembly 4 can be separated from the first substrate 3, by stripping the second carrier plate 6 off the rigid substrate 1, and the rigid substrate 1 still adheres to the first carrier plate 2, which helps to form the new light emitting assembly on the second surface of the rigid substrate 1 in a subsequent step.

The step of forming a new light emitting assembly 4 on the surface of the rigid substrate 1 distal to the first substrate 3 includes steps of:

causing the drain to face upward; and forming the new light emitting assembly 4 on the surface of the rigid substrate 1 distal to the first substrate 3.

Alternatively, the repairing method may also employ the other separation method, which includes stripping the rigid substrate 1 off a surface of the first carrier plate 2 distal to the first substrate 3; then, fixing the stripped first carrier plate 2 on a fixing substrate, such as a rigid substrate (such as, a glass substrate), with the drain facing upward; and forming a new light emitting assembly 4 on the fixing substrate.

With the fixing substrate and the drain facing upward, the light emitting assembly 4 can be formed more easily.

From the above, in the repairing method of display apparatus according to the embodiment of the present disclosure, the light emitting assembly can be separated from the first substrate, such that when the light emitting assembly or the first substrate suffers from failure, it can be replaced easily, which can prevent the entire display apparatus from becoming useless, reducing the manufacturing cost.

The display apparatus according to an embodiment of the present disclosure may be any product or component having a function of display such as a desktop, a tablet PC, a laptop, a mobile phone, a PDA, a GPS, an on-board display, a projection display, a camera, a digital camera, an electronic watch, a calculator, an electronic instrument, a meter, a liquid crystal panel, an electronic paper, a television, a display, a digital photo frame, and a navigator, which may be applied to various fields, such as a public display and a virtual display.

It should be understood that the above embodiments are merely exemplary embodiments used only for illustrating the principle of the present disclosure. However, the present disclosure is not limited thereto. Obviously, those skilled in the art can make various modifications and variants to this disclosure without departing from spirit and scope of this disclosure. As such, if these modifications and variants of this disclosure fall into the scope of the claims and their equivalents, the present disclosure intends to include these modifications and variants.

What is claimed is:

1. A display apparatus, comprising:

a rigid substrate;

a first carrier plate provided on a first surface of the rigid substrate;

a first substrate provided on the first carrier plate, the first substrate comprising a thin film transistor with a drain;

a light emitting assembly provided on a second surface of the rigid substrate opposite to the first surface, the light emitting assembly comprising an anode and a light emitting layer provided successively along a direction distal to the rigid substrate; and a via hole provided penetrating the rigid substrate and the first carrier plate, a part of the anode being in electrical contact with a part of the drain through the via hole.

2. The display apparatus of claim 1, further comprising: a groove provided on a surface of the first carrier plate at a side of the first substrate, wherein the drain comprises a body and a connection extension portion; the body is provided on the first carrier plate at a side of the groove; and the connection extension portion extends from one end of the body into the groove; and an orthographic projection of the via hole on the rigid substrate is within an orthographic projection of the groove on the rigid substrate.

3. The display apparatus of claim 2, wherein a width of the groove is greater than a diameter of the via hole.

4. The display apparatus of claim 1, wherein the first carrier plate is a flexible substrate.

5. The display apparatus of claim 4, wherein the thin film transistor comprises a drain, a source, an active layer, a gate insulation layer, a gate layer, a gate protection layer and a planarization layer provided successively.

6. The display apparatus of claim 5, wherein the light emitting assembly comprises an anode, a pixel definition layer, a light emitting layer and a photoresist spacer provided successively.

7. The display apparatus of claim 6, further comprising: a second carrier plate provided on the second surface of the rigid substrate, wherein the light emitting assembly is provided on the second carrier plate; and the via hole penetrates the second carrier plate.

8. The display apparatus of claim 7, wherein the second carrier plate is a flexible substrate.

9. The display apparatus of claim 6, wherein the part of the anode being in electrical contact with the part of the drain through the via hole is provided in the via hole, and a part of the pixel definition layer is provided on the part of the anode in the via hole.

10. A repairing method for the display apparatus of claim 1, comprising steps of:

stripping the rigid substrate off a surface of the first carrier plate distal to the first substrate; and forming a new light emitting assembly on the surface of the first carrier plate distal to the first substrate.

11. The repairing method for the display apparatus of claim 10, wherein the step of forming a new light emitting assembly on the surface of the first carrier plate distal to the first substrate comprises steps of:

fixing the stripped first carrier plate on a fixing substrate with the drain facing upward; and forming the new light emitting assembly on a surface of the fixing substrate.

12. A repairing method for the display apparatus of claim 7, comprising steps of:

stripping the second carrier plate off a surface of the rigid substrate distal to the first substrate; and forming a new light emitting assembly on the surface of the rigid substrate distal to the first substrate.

13. The repairing method for the display apparatus of claim 12, wherein the step of forming a new light emitting assembly on the surface of the rigid substrate distal to the first substrate comprises steps of:

causing the drain to face upward; and forming the new light emitting assembly on the surface of the rigid substrate distal to the first substrate.

14. The repairing method for the display apparatus of claim 12, further comprising steps of:

stripping the rigid substrate off a surface of the first carrier plate distal to the first substrate;

fixing the stripped first carrier plate on a fixing substrate with the drain facing upward; and forming a new light emitting assembly on the fixing substrate.

15. A manufacturing method of a display apparatus, comprising steps of:

preparing a rigid substrate;

forming a first carrier plate on a first surface of the rigid substrate;

forming a first substrate on the first carrier plate, such that the first substrate comprises a thin film transistor with a drain;

forming a via hole penetrating the rigid substrate and the first carrier plate; and forming a light emitting assembly on a second surface of the rigid substrate opposite to the first surface, such that the light emitting assembly comprises an anode and a light emitting layer provided successively along a direction distal to the rigid substrate;

wherein a part of the anode is in electrical contact with a part of the drain through the via hole.

16. The manufacturing method of a display apparatus of claim 15, wherein the step of forming a first carrier plate on a first surface of the rigid substrate comprises steps of:

forming a whole film layer for the first carrier plate on the first surface of the rigid substrate; and forming a groove in the whole film layer for the first carrier plate.

17. The manufacturing method of a display apparatus of claim 16, wherein the drain comprises a body and a connection extension portion; the body is provided on the first carrier plate at a side of the groove; the connection extension portion extends from one end of the body into the groove; and an orthographic projection of the via hole on the rigid substrate is within an orthographic projection of the groove on the rigid substrate.

18. The manufacturing method of a display apparatus of claim 17, wherein the step of forming the via hole is performed by using a wet etching method.

19. The manufacturing method of a display apparatus of claim 18, wherein the step of forming the light emitting assembly on the second surface of the rigid substrate opposite to the first surface comprises steps of:

forming a second carrier plate on the second surface of the rigid substrate; and forming the light emitting assembly on the second carrier plate;

the step of forming a via hole penetrating the rigid substrate and the first carrier plate further comprises:

forming a via hole penetrating the second carrier plate, the rigid substrate and the first carrier plate.

20. The manufacturing method of a display apparatus of claim 15, wherein the part of the anode is formed in the via hole, and the manufacturing method further comprises forming a pixel definition layer such that a part of the pixel definition layer is formed on the part of the anode in the via hole.

* * * * *